United States Patent
Sherman

(10) Patent No.: US 7,399,357 B2
(45) Date of Patent: Jul. 15, 2008

(54) ATOMIC LAYER DEPOSITION USING MULTILAYERS

(76) Inventor: Arthur Sherman, 600 Sharon Park Dr., Suite C-307, Menlo Park, CA (US) 94025

( * ) Notice: Subject to any disclaimer, the term of this patent is extended or adjusted under 35 U.S.C. 154(b) by 561 days.

(21) Appl. No.: 10/435,309

(22) Filed: May 8, 2003

(65) Prior Publication Data

US 2004/0221798 A1 Nov. 11, 2004

(51) Int. Cl.
*C30B 25/02* (2006.01)
*C30B 25/00* (2006.01)

(52) U.S. Cl. ............................. 117/92; 117/84; 117/88; 117/91; 117/99; 117/103; 117/108; 117/944; 117/950

(58) Field of Classification Search ................... 117/84, 117/88, 91, 92, 99, 103, 108, 944, 950
See application file for complete search history.

(56) References Cited

U.S. PATENT DOCUMENTS

| | | | |
|---|---|---|---|
| 5,916,365 A | 6/1999 | Sherman | |
| 6,200,893 B1 | 3/2001 | Sneh | |
| 6,342,277 B1 * | 1/2002 | Sherman | ..................... 427/562 |
| 6,451,695 B2 | 9/2002 | Sneh | |
| 6,475,910 B1 | 11/2002 | Sneh | |
| 6,486,047 B2 | 11/2002 | Lee et al. | |
| 6,537,925 B2 | 3/2003 | Kim et al. | |

(Continued)

FOREIGN PATENT DOCUMENTS

EP 0442490 8/1991

OTHER PUBLICATIONS

Bedair, S.M., "Atomic layer epitaxy deposition processes" J. Vac. Sci. Technol. B12, 179 (1994).

(Continued)

*Primary Examiner*—Robert Kunemund
*Assistant Examiner*—Matthew J Song
(74) *Attorney, Agent, or Firm*—MacPherson Kwok Chen & Heid LLP; Edward C. Kwok

(57) ABSTRACT

A method for the controlled growth of thin films by atomic layer deposition by making use of multilayers and using energetic radicals to facilitate the process is described in this invention. In this method, a first reactant is admitted into the reaction chamber volume, where there is a substrate to be coated. This first reactant then adsorbs, in a self-limiting process, onto the substrate to be coated. After removing this first reactant from the reaction chamber volume, leaving a layer coating the substrate, a second reactant is then admitted into the reaction chamber volume, which adsorbs onto this initial layer in a self-limiting process. The second reactant is then also removed from the reaction chamber volume. Following this procedure a self-limited multilayer of unreacted species remains adsorbed on the substrate to be coated. If additional chemical species are desirable, these exposures and removals could be continued. Next this multilayer is exposed to a flux of radicals. In particular, radicals are chosen that will not damage or have any deleterious effect on the surface underlying the deposited film. When these energetic radicals interact with the surface and release their energy, a chemical reaction between the adsorbed species is induced, and a layer of solid reaction product can be formed. This process is repeated to grow a thin film of any desired thickness.

13 Claims, 2 Drawing Sheets

U.S. PATENT DOCUMENTS

| | | | | |
|---|---|---|---|---|
| 6,576,053 | B1* | 6/2003 | Kim et al. | 117/89 |
| 6,673,701 | B1* | 1/2004 | Marsh et al. | 438/493 |
| 2002/0068458 | A1 | 6/2002 | Chiang et al. | |
| 2002/0076946 | A1 | 6/2002 | Kim et al. | |
| 2002/0104481 | A1 | 8/2002 | Chiang et al. | |
| 2003/0003635 | A1* | 1/2003 | Paranjpe et al. | 438/149 |
| 2003/0008072 | A1 | 1/2003 | Lee et al. | |
| 2003/0017697 | A1 | 1/2003 | Choi et al. | |
| 2003/0040196 | A1 | 2/2003 | Lim et al. | |
| 2003/0070617 | A1 | 4/2003 | Kim et al. | |

OTHER PUBLICATIONS

Chae, B.-G., et al, "New high-k $SrTa_2O_6$ gate dielectrics prepared by plasma-plasma-enhanced atomic layer chemical vapor deposition" J. Appl. Phys. 41, L729 (2002).

Chen, C-C., et al, "Remote plasma enhanced atomic layer deposition (RPEALD) nitride/oxide gate dielectric for sub-65 nm low standby power CMOS application" 2003 Symposium on VLSI Technology, Kyoto, Japan.

Cheng, D., et al, "The integration of plasma enhanced atomic layer deposition (PEALD) of tantalum-based thin films for copper diffusion barrier applications" Mat.Res. Soc. Symp. Proc. 766, E10.4.1 (2003).

Choi, S.W., et al, "Plasma enhanced atomic layer deposition of $Al_2O_3$ and $Ta_2O_5$" American Vacuum Society ALD Conference, Korea, Aug. 2002.

Choi, S-W., et al, "Plasma enhanced atomic layer deposition of $Al_2O_3$ and TiN" Joint International Plasma Symposium of 6th APCPST, 15th SPSM, OS2002 and 11th KAPRA Conf., Jul. 2002, Korea.

De Keijser, M., et al, "Atomic layer epitaxy of gallium arsenide with the use of atomic hydrogen" Appl. Phys. Lett. 58, 1187 (1991).

Endo, K., et al, "Atomic layer deposition of high-k gate dielectrics using MO precursor and cyclic plasma exposure" Mat. Res. Soc. Symp. Proc. 745, N2.8.1 (2003).

Fujiwara, H., et al, "Low temperature growth of $ZnS_xSe_{1-x}$ alloys fabricated by hydrogen radical enhanced chemical vapor deposition in an atomic layer epitaxy mode" J. Appl. Phys. 74, 5510 (1993).

Gotoh, J., et al, "Low temperature growth of ZnSe-based pseudomorphic structures by hydrogen-radical-enhanced chemical vapor deposition" J. Cryst. Growth 117, 85 (1992).

Greer, F., et al, "Fundamental beam studies of radical enhanced atomic layer deposition of TiN" J. Vac. Sci. Technol. A21, 96 (2003).

Hasunuma, E., et al, "Gas phase reaction controlled atomic layer epitaxy of silicon" J. Vac. Sci. Technol. A16, 679 (1998).

Hiramatsu, K., et al, "Formation of TiN films with low Cl concentration by pulsed plasma chemical vapor deposition" J. Vac. Sci. Technol. A14, 1037 (1996).

Imai, S., et al, "Atomic layer epitaxy of silicon using atomic H" Thin Solid Films 225,168 (1993).

Jeong, C-W., et al, "Plasma assisted atomic layer growth of high quality aluminum oxide thin films" Jpn. J. Appl. Phys. 40, 285 (2001).

Kil, D-S., et al, "Low-temperature ALD growth of $SrTiO_3$ thin films from Sr β-diketonates and Ti alkoxide precursors using oxygen remote plasma as an oxidation source" Chem. Vap. Deposition 8, 195 (2002).

Kim, H., et al, "Growth of cubic-TaN thin films by plasma-enhanced atomic layer deposition" J. Appl. Phys. 92, 7080 (2002).

Kim, H., et al, "The growth of tantalum thin films by plasma-enhanced atomic layer deposition and diffusion barrier properties" Mat. Res. Soc. Proc. 716, B8.5.1 (2002).

Kim, H., et al, "Growth kinetics and initial stage growth during plasma-enhanced Ti atomic layer deposition" J.Vac. Sci. Technol. A20, 802 (2002).

Kim, Y.T., et al, "Pulse plasma enhanced atomic layer deposition of tungsten nitride diffusion barrier for copper multi-level interconnect" 201st Electrochemical Society Mtg., Phila., PA, May, 2002.

Kim, J.Y., et al, "Characteristics of TiN films deposited by remote plasma enhanced atomic layer deposition method" Jpn. J. Appl. Sci. 42, L414 (2003).

Koleski, D.D., et al, "Atomic layer epitaxy of Si on Ge(100) using $Si_2Cl_6$ and atomic hydrogen" Appl. Phys. Lett. 64, 884 (1994).

Lee, Y.J., et al, "Ti-Al-N thin films prepared by the combination of metalorganic plasma-enhanced atomic layer deposition of Al and TiN" Electrochem. Solid-State Lett. 6, C-70 (2003).

Lee, Y.J., et al, "Atomic layer deposition of aluminum thin films using an alternating supply of trimethylaluminum and a hydrogen plasma" Electrochem. Solid-State Lett. 5, C91 (2002).

Mahajan, A., et al, "Si atomic layer epitaxy based on Si2 H6 and remote He plasma bombardment" Thin Solid Films 225, 177 (1993).

Meguro, T., et al, "Effects of active hydrogen on atomic layer epitaxy of GaAs" Appl. Surf. Sci. 112, 118 (1997).

Park, J-S., et al, "Plasma-enhanced atomic layer deposition of Ta-N thin films" J. Electrochem. Soc. 149, C28 (2002).

Song, H-J., et al, "Tantalum oxide films grown by plasma enhanced atomic layer deposition" Second International Conference on Microelectronics and Interfaces, AVS, Feb. 2001, Santa Clara, CA.

Sugahara, S., et al, "Atomic layer epitaxy of germanium" Appl. Surf. Sci. 82/83, 380 (1994).

Sugahara, S., et al, "Atomic hydrogen assisted ALE of germanium" Appl. Surf. Sci. 90, 349 (1995).

Sugahara, S., et al, "Modeling of silicon atomic layer epitaxy" Appl. Surf. Sci. 107, 161 (1996).

Wisotski, E., et al, "Room temperature growth of $ZrO_2$ thin films using a novel hyperthermal oxygen atom source" J. Vac. Sci. Technol. A17, 14 (1999).

Zhang, Z., et al, "Plasma enhanced NLD TiN barrier for sub-micron (<130 nm) ICs applications" AVS ALD 2002 Conference, Aug. 2002, Korea.

* cited by examiner

1

ATOMIC LAYER DEPOSITION USING MULTILAYERS

CROSS-REFERENCE TO RELATED APPLICATIONS

Not Applicable

FEDERALLY SPONSORED RESEARCH

Not Applicable

SEQUENCE LISTING OR PROGRAM

Not Applicable

BACKGROUND OF THE INVENTION

Field of Invention

The present invention describes a new method of deposition of solid thin films of any composition, onto a substrate, using the technique of atomic layer deposition (ALD). The self-limited layer being converted at each cycle contains two or more unreacted chemical species (a multilayer). These species, contained in a multilayer, are chosen such that they are capable of undergoing a chemical reaction, where one of the reaction products can be a solid. Instead of heating the substrate to enable the chemical reaction to proceed, the energy released from the deexcitation of an impinging flux of energetic radicals is used. Specifically, the radicals used are those that do not damage or have any deleterious effect on the surface underlying the deposited film.

Atomic Layer Deposition (ALD) is a recent variation on the older technology referred to as Chemical Vapor Deposition (CVD). Over the years most CVD processes have used a mixture of two or more gases flowing over a heated substrate so that a chemical reaction may occur between the reactant gases at the substrate surface. When the reaction products include solid species this allows a thin solid film to grow on the surface. The optimum choice of reactants for a CVD process is generally a mixture of the most reactive gases available. This allows film deposition at the highest rates, and at the lowest substrate temperatures. However, since the gas approaching the heated surface will be heated by gas phase conduction, it would also be desirable if the gas mixture were to remain thermally stable until it impinges the surface. If the mixture is not thermally stable gas phase reactions can occur, and then in the worst case one can have particles forming in the gas phase which end up being imbedded in the growing thin film.

Therefore, one has to compromise on the choices of gas phase reactants to use. It is this situation that has fueled much of the CVD research over the last thirty years.

For the invention described in this patent application, we use a method of depositing a thin film by the related technique of atomic layer deposition (ALD). In this deposition method, the presentation of the two reactants to a heated substrate is separated into two steps. In step one, the substrate is exposed to a first chemical reactant after which this reactant is removed from the reaction chamber volume. During this exposure approximately one monolayer of the first reactant adsorbs onto the substrate, and remains after this reactant is removed from the chamber. Next, the substrate coated with the first reactant is exposed to a second reactant, which is introduced into the chamber. Provided that the substrate is hot enough, the two reactants react to form a layer of the solid film being sought. After this, the unreacted gaseous second reactant and any reaction products are removed from the reaction chamber volume. This process is repeated as many times as necessary to grow a film of the desired thickness. Clearly with this process, gas phase reactions can be eliminated, so that one is free to choose the most reactive reactants available and film deposition temperatures can be lower. Unfortunately, the one disadvantage is that the film deposition rate is low. For those applications where very thin films are of interest, this becomes less of a limitation.

In many applications, this thermal ALD method produces acceptable films. There are instances, however, where either it is impractical to deposit a particular film or the film quality is not as good as desired. For those situations, a newer technique that makes use of more energetic second reactants can be used to facilitate the process. Such a technique is described in U.S. Pat. No. 5,916,365 and can be referred to as radical enhanced ALD.

For this process, the second reactant in the cycle is a radical, which is just a very energetic chemical species that will react readily with the adsorbed first reactant at a modest temperature.

In general a radical would be defined as any unstable or excited species that may be found when a stable gas is subjected to a glow discharge. For a monatomic stable species such as a noble gas (He, Ne, Ar, Kr, Xe, or Rn) it could be an electronically excited atom, which would be very energetic but not chemically active. In other words, we would not expect the noble gas atom to participate in any chemical reaction other than to contribute its excitation energy when it is deexcited. When the stable gaseous species is a molecule, it could be an unstable ground state atom or molecule created by dissociation which may participate in a chemical reaction. In addition, any of the atomic or molecular species created in such a glow discharge could also be electronically excited. Finally, in any glow discharge ions, which are electrically charged species, will be formed.

As a simple example, a glow discharge in helium gas will produce electronically excited helium (He*), and helium ions (He$^+$, electrically charged atoms). A slightly more complex example would be a glow discharge in hydrogen gas ($H_2$), which will then dissociate to produce ground state hydrogen atoms (H), electronically excited hydrogen atoms (H*), and hydrogen ions (electrically charged hydrogen atoms or molecules). Finally, a more complex example would be a glow discharge in a polyatomic gas. For example, a glow discharge in ammonia vapor ($NH_3$) will produce a number of atomic and molecular species, such as N, NH, H, $NH_2$, $H_2$, $N_2$, etc. Any of these could be electronically excited or electrically charged.

All of these radicals will cease to exist when no longer under the influence of the glow discharge. Some will disappear quickly, such as most electronically excited species, by radiating away their excitation energy. One exception would be metastable species, which are excited into forbidden electronic states. These typically survive for appreciable times. Atomic and molecular fragments will be lost due to recombination into stable molecular species (i.e. H+H→$H_2$). Finally, ions will be lost when they recombine with other charged species (i.e. H$^+$+e$^-$→H). All of these radicals will release considerable energy when they return to their unexcited ground state, and this energy is useful in promoting the surface reactions we are interested in. As a result, it is no longer necessary to heat the surface to a high temperature to achieve a surface chemical reaction. A number of useful radicals are described in U.S. Pat. No. 5,916,365.

It is also important to note that with the availability of energetic chemically active radicals to enable surface reactions at lower temperatures, many more ALD reactions become feasible and strict reliance on high temperature adsorption of reactants is no longer mandatory.

In all of the above discussion, no mention has been made of the material onto which we wish to grow our film. In many cases, this may not be of any concern. However, the radicals are very energetic, and may also be chemically active. Therefore, there can be some situations where the presence of a radical on the initial surface may be harmful. For example, it is well known that radical enhanced ALD can be used to deposit electrically conducting films (i.e. metals) using hydrogen atoms to reduce suitable reactants. For oxide films it would be appropriate to use oxygen atoms to oxidize available reactants. Now for those instances where we wish to deposit electrically conducting metallic films onto oxides, or oxides onto electrically conducting metallic materials, there can be a disadvantage to the use of certain chemically active radicals. For example, initially growing a partial monolayer of metal onto a layer of oxide, using hydrogen atoms as the second reactant, could result in some reduction in the thickness of the underlying oxide. Such reduction could cause the oxide layer to thin significantly thereby reducing its dielectric strength. Similarly, growing a partial layer of oxide onto a metal layer with oxygen atoms as the second reactant, would result in some oxidization of the underlying metal film thereby increasing its electrical resistance. This matter would be of greatest concern when depositing onto very thin layers. Since the growth of extremely thin layers (i.e. 10-100 Å) is being explored today for many advanced integrated circuits, a solution to this concern is of commercial importance.

In a recent ALD paper, Y. J. Lee and S-W. Kang, *Ti—Al—N Thin Films Prepared by the Combination of Melallorganic Plasma-Enhanced Atomic Layer Deposition of Al and TiN*, Electrochem. Solid-State Lett. 6, C-70 (2003), there is a description of an ALD process where within each cycle a hot substrate is exposed sequentially to two stable chemical reactants, and then a glow discharge in hydrogen gas. However, the authors are performing a thermal ALD process by relying on heat to cause the two adsorbed reactants to undergo a surface chemical reaction to first form a stable thin film. Then the hydrogen radicals are used to remove impurities from this film. Clearly, if this process were to be used to deposit such a film over a thin oxide layer, the hydrogen plasma would reduce the oxide, and possibly diffuse into underlying structures damaging them as well.

SUMMARY

In one embodiment, the present invention provides a method for the application of radical enhanced ALD while limiting the use of certain chemically reactive radicals, when desirable. This method operates by creating an adsorbed multilayer of stable chemical species, which is then chemically converted with energy released from a flux of energetic radicals. If one of the products of this surface reaction is a solid, a thin film will be formed. The process requires a minimum of three exposures for each cycle, and the cycle is then repeated many times to grow a thin film of any desired thickness.

It is the object of this invention to allow growth of low temperature, uniform and conformal, thin films of any material from adsorbed stable molecular species (a multilayer) using radicals to facilitate the surface chemical reaction. In particular, this new process can enable the growth of solid thin films without the introduction of radical species that may react with or damage the surface being deposited onto.

DRAWING—FIGURES

DRAWINGS—REFERENCE NUMERALS

| | |
|---|---|
| 1 | first reactant |
| 2 | second reactant |
| 3 | inert carrier gas |
| 4 | valve |
| 5 | valve |
| 6 | valve |
| 7 | reaction chamber |
| 8 | electrical power supply |
| 9 | valve |
| 10 | vacuum pump |
| 11 | control system |

DETAILED DESCRIPTION—FIGS. 1 AND 2—PREFERRED EMBODIMENT

Figure 1:
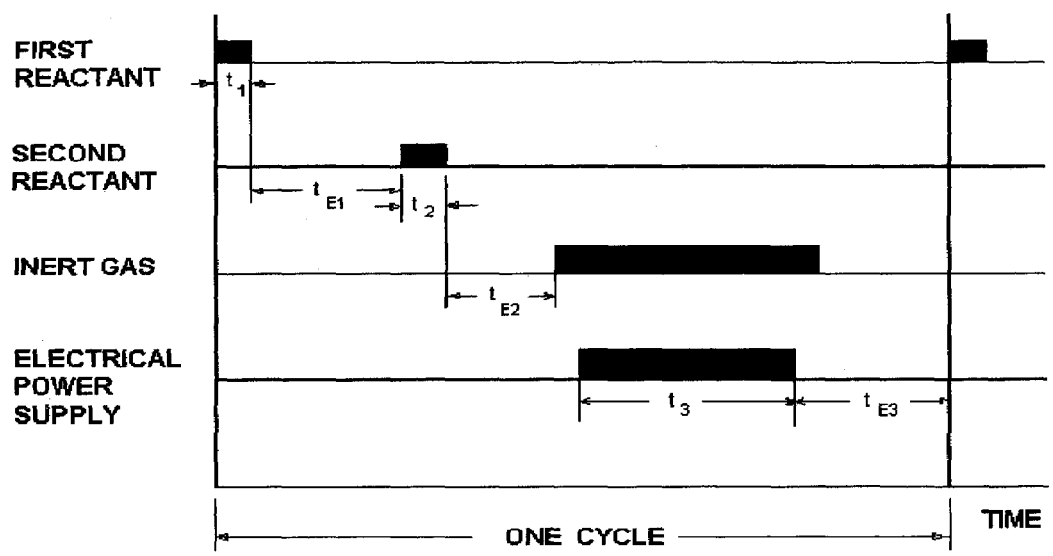
FIG. 1 illustrates a process cycle for the radical enhanced ALD growth of a thin film from a multilayer.

FIG. 1 is a timing cycle showing the first of many cycles that can be used to create and convert a multilayer to a solid thin film at low temperature, while avoiding reactive species that might damage the material being deposited on. All of the reactants are delivered to the reaction chamber as gaseous materials. If any one of them is liquid or solid at room temperature, that reactant has to be heated to provide adequate vapor pressure. In order to move gases into and out of a reaction chamber, while maintaining a low chamber pressure, well below atmospheric, a vacuum pump will be required at the chamber exhaust. Reaction chamber pressure will typically range around 1 torr, or less. In some cases, the reactant may be carried into the reaction chamber with the aid of an inert gas. This gas will not participate in the surface reactions we will be interested in chemically, since it is by definition inert.

Prior to the first cycle, the vacuum pump is typically used to lower air pressure sufficiently to enable introduction of the first reactant. As shown in FIG. 1, the first reactant is introduced into the evacuated reaction chamber for $t_1$ seconds. This should enable this material to adsorb onto the substrate surface. Next this reactant is removed from the reaction chamber volume for $t_{E1}$ seconds, with the aid of the vacuum pump, leaving behind approximately one or more monolayers on the substrate. Following this step, a second reactant is introduced into the reaction chamber in a similar fashion, with an exposure of $t_2$ seconds. This should enable approximately one monolayer of the second reactant to adsorb onto the substrate, forming a multilayer. As before, this second reactant is removed from the reaction chamber volume by pumping with the vacuum pump for $t_{E2}$ seconds.

The time required to effect the evacuation will depend on a number of hardware issues, such as reaction chamber volume, vacuum pump size, desired final low pressure, etc. If an inert gas is used as the carrier for the reactants, then we can accomplish the removal of each reactant by reducing its partial pressure to some acceptably low value.

With the multilayer in place at the end of $t_{E2}$, an inert gas is introduced into the reaction chamber and a glow discharge established a short time later by activating the electrical power supply to produce the desired radical species. The radical flux is then maintained by applying the glow discharge for $t_3$ seconds, the time needed to promote the surface reaction desired. After the electrical power supply is turned off, and the glow discharge is extinguished, the inert gas will continue to flow for a short time. Next, the inert gas can be removed by pumping for $t_{E3}$ seconds with the vacuum pump. Upon completion of this evacuation, the cycle can be repeated. Depending on the film thickness desired, many additional cycles can be run.

Under some circumstances it may be desirable to allow the inert gas to flow continuously during the process. This would still require a vacuum pump to be running to maintain the necessary low pressure in the chamber. In this case the cycle of FIG. 1 would be the same, and the radical generation would begin whenever the electrical power supply was turned on. It would end when the electrical power supply was turned off.

The process described above can be carried out in any one of the radical enhanced ALD reactors described in the recent patent literature (see list of patents in references). The essential components of such a reactor are shown schematically in FIG. 2. The ALD reactor 7 consists of a vacuum tight reaction chamber where a substrate can sit on a susceptor which may be heated. In addition, it will include a means of creating the radicals needed to operate this process. Two ways to create such radicals using a glow discharge are described in U.S. Pat. No. 5,916,365. One is referred to as a direct plasma technique. In this case, a glow discharge is created in the reaction chamber where the substrate sits, and the substrate surface is exposed to all of the radicals created including ions. For those cases where the ion energy is large enough to damage the material on which the film is being grown, one can resort to the use of a remote plasma. That is, the plasma is created in an area of the reaction chamber a distance from the substrate, and only the neutral radicals are able to strike the substrate.

Figure 2:
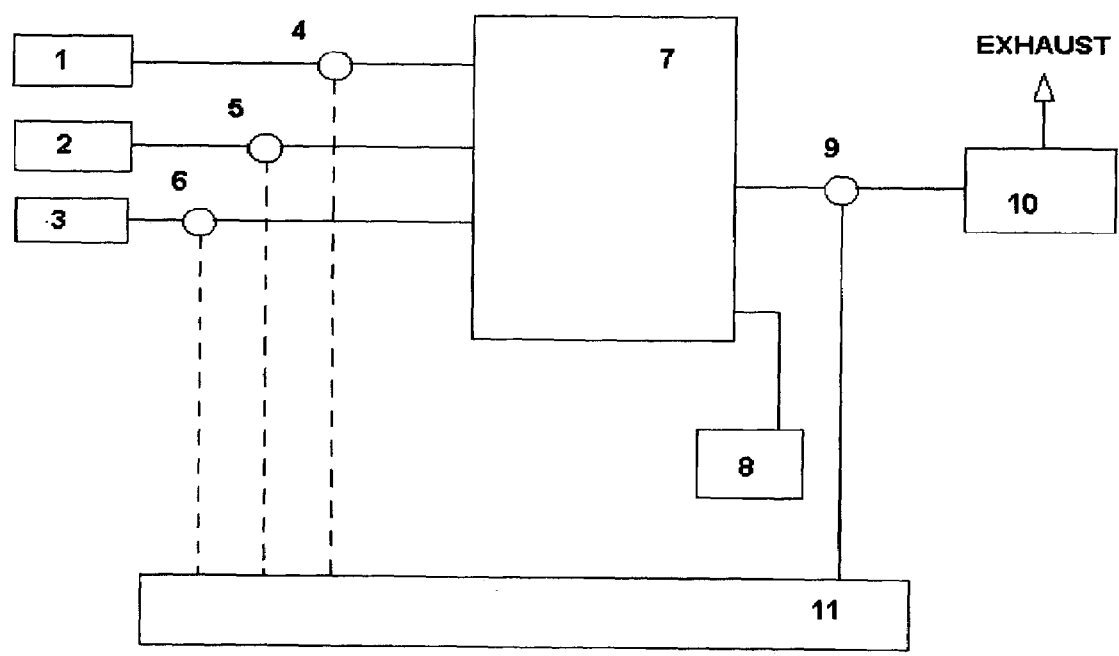
FIG. 2 is a schematic drawing of a typical radical enhanced ALD reactor that can be used for the deposition of films from multilayers.

As shown in FIG. 2, the reactants 1 and 2 are introduced to the reaction chamber, through electrically operated valves 4 and 5. Typically, the reactants are the vapors from a liquid or solid source. They may be pulsed in as a pure vapor or they may be entrained in an inert carrier gas. The inert gas 3 used to create radicals in the glow discharge is introduced through valve 6. Radicals are created in the chamber 7 by activating the electrical power supply 8. Finally, one more electrically operated valve 9 can be used to completely isolate the reaction chamber from the vacuum pump 10, if desired. All valves as well as the glow discharge electrical power supply are operated by control system 11, which is typically a dedicated small computer system.

As noted earlier, there are two ways to operate such a system, and from a process point of view they create entirely equivalent films. In one mode, either of the two reactants 1 and 2 can be introduced into a closed reaction chamber, by opening for a short time (pulsing) either valve 4 or 5. All valves are left closed after the pulse for a short period of time. After this time, valve 9 would be opened and the vacuum pump 10 would remove any gaseous residual. However, the time needed to reduce the reactant residual vapor pressure down to an acceptable level may be excessive. In this case, purging the reaction chamber with an inert gas could be useful. Accordingly, the second mode leaves valve 6 and 9 open at all times, so that an inert gas 3 is always flowing. When one of the two first reactants is to be supplied, valve 4 or 5 is opened (pulsed), and the reactant is entrained in the inert gas flow. When radicals are being generated from the inert gas alone the electrical power supply 8 is turned on. This second mode is equivalent to the cycle purge technique commonly used in the semiconductor industry to rapidly and efficiently remove reactive gases from gas lines and reaction chambers.

In the semiconductor industry a substrate would be a silicon or compound semiconductor wafer. In those situations in this industry where single wafer reactor systems are chosen, throughput (wafers per hour) can be an important issue. Accordingly, commercial single wafer reactors are often designed to run in the second mode. However, in some cases batch reactors (many wafers processed at one time) are preferred, and then operation in the first mode may be appropriate.

EXAMPLE 1

Deposition of thin films of titanium nitride (TiN) onto any substrate surface, but particularly oxide surfaces, can be accomplished from the reaction between titanium tetrachloride ($TiCl_4$) and ammonia ($NH_3$) using a multilayer at moderate temperatures, without exposing the surface to any flux of reducing radicals. By the present process, we expose the surface to a first flux of $TiCl_4$ vapor, which then creates a self-limited layer of this compound on the substrate surface. Next, we expose this surface coated with a layer of $TiCl_4$ molecules to a second flux of $NH_3$ vapor, which creates a multilayer of $TiCl_4$ and $NH_3$. Finally, we expose this multilayer to a flux of atomic nitrogen radicals created in a glow discharge. Energy delivered to the multilayer when the nitrogen atoms recombine to reform nitrogen molecules will stimulate a chemical reaction to convert it to approximately a monolayer of TiN, according to the following formula.

$$TiCl_4 + NH_3 + 2N \text{ (recombination energy)} \rightarrow TiN(s) + 3HCl\uparrow + 1/2CL_2\uparrow + N_2\uparrow$$

A similar result will be obtained if we create a glow discharge in a noble gas, because many energetic radicals (ions and metastable species) will be formed. When these radicals impinge the substrate surface they will give up their energy to the surface, again facilitating the above chemical reaction.

Of particular importance, we observe that neither the nitrogen atoms nor metastable noble gas atoms are capable of reducing any oxide surface that the TiN film may be grown on.

In order to confirm the feasibility of executing the above process, a deposition was carried out on a sample of non-conducting thermally oxidized silicon. Deposition temperature was 200° C., and the times used, as shown in FIG. 1, were

| $t_1$ = 2 sec, | $t_2$ = 2 sec, | $t_3$ = 30 sec |
| $t_{E1}$ = 4 sec, | $t_{E2}$ = 2 sec, | $t_{E3}$ = 2 sec | for a cycle time of 42 sec. A total of 400 cycles were carried out using a remote nitrogen plasma generated inductively by a coil operated at 350 watts and a frequency of 13.56 Hz. The purge gas was also nitrogen.

The substrate surface was observed to be electrically conducting and coated with a hard adherent TiN film. The film could not be scratched, and was adherent enough to pass the scotch tape test.

EXAMPLE 2

Aluminum oxide ($Al_2O_3$) can also be deposited, by this new process, at a low temperature from a trimethyl aluminum -TMA-($Al(CH_3)_3$) and water vapor ($H_2O$) multilayer by this new process, with radicals that will not oxidize an underlying metal surface. In a first exposure, the substrate is exposed to TMA vapor, which will leave a self-limited layer of TMA on its surface. Next, this surface is exposed to water vapor, which will leave a second self-limited layer of $H_2O$ molecules on the initial layer. This multilayer will than be exposed to a flux of metastable atoms, such as He*. As before, when the He* gives up its excitation energy to the surface, that energy will cause a chemical reaction in the multilayer to yield aluminum oxide.

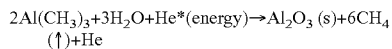

Again we recognize that no radicals that could oxidize any underlying material (such as oxygen atoms) have been used.

EXAMPLE 3

Next, we can deposit elemental films, either conductors or semiconductors by a similar technique. For example, titanium (Ti) can be deposited from titanium tetrachloride ($TiCl_4$) and hydrogen ($H_2$). The first exposure would be to $TiCl_4$ vapor resulting in a self-limited layer of this molecule on the substrate. A second exposure to hydrogen gas ($H_2$) would result in another self-limited layer of hydrogen molecules on top of the first layer. This multilayer would then be converted to titanium metal by a flux of excited noble gas atoms. Again, a glow discharge in He would produce the desired He* radicals.

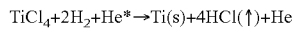

Again, no reducing radicals (such as hydrogen atoms) would be present to attack an underlying surface of oxide.

EXAMPLE 4

Finally, we can deposit carbide films by a similar technique. For example, silicon carbide (SiC) can be deposited from silicon tetrachloride ($SiCl_4$) and methane ($CH_4$). The first exposure would be to $SiCl_4$ vapor resulting in a self-limited layer of this molecule on the substrate. A second exposure to methane gas ($CH_4$) would result in another self-limited layer of methane molecules on top of the first layer. This multilayer could then be converted to silicon carbide by a flux of excited noble gas atoms, such as He*.

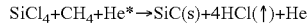

Again, no reducing radicals (such as hydrogen atoms) or oxidizing radicals (such as oxygen atoms) would be present to attack an underlying surface.

While the invention has been illustrated specifically with regard to particular methods of carrying out the same, it is clear that variations and modifications can be made. It will also be evident from the earlier discussion that the present invention will substantially advance the state of the art in the commercial application of radical enhanced Atomic Layer Deposition of thin films. The method of this invention uniquely enables application of radical enhanced processes to situations where oxides are to be deposited onto metallic electrical conductors, or where metallic electrical conductors are to be deposited onto oxides.

While the invention has been particularly shown and described with reference to preferred embodiments, it will be understood by those skilled in the art that the foregoing and other changes in the form and details may be made without departing from the spirit or scope of the invention.

I claim:
1. A process of growing a thin film on a substrate in a reaction chamber by an atomic layer deposition process comprising a plurality of cycles, wherein at least one cycle comprises, in sequence:
   exposing the substrate to a gaseous first reactant, including an element of the thin film to be formed, wherein at least a portion of the first reactant adsorbs on the substrate;
   stopping provision of the gaseous first reactant and removing substantially all of the gaseous first reactant from the volume of the reaction chamber;
   exposing the substrate, coated with at least a portion of the first reactant, to a gaseous second reactant, wherein at least a portion of the second reactant adsorbs on the substrate without chemically reacting with the first reactant, thereby forming a multilayer of the first reactant and the second reactant;
   stopping provision of the gaseous second reactant and removing substantially all of the gaseous second reactant from the volume of the reaction chamber;
   exposing the substrate, coated with the multilayer of first and second reactants, to a gaseous third reactant of radicals, wherein the radicals cause a chemical reaction which converts the multilayer to one or more elements or compounds, wherein a thin film is formed; and
   stopping provision of the gaseous third reactant of radicals, and removing the gaseous third reactant of radicals, as well as any reaction products, from the reaction chamber;
   wherein one of the gaseous reactants comprises trimethyl aluminum, the second gaseous reactant comprises water vapor, and the gaseous radicals are electronically excited noble gas atoms that convert the multilayer of trimethyl aluminum and water vapor to a thin film of aluminum oxide.

2. The process of claim 1, wherein the gaseous third reactant of radicals is chosen so as to not chemically interact with the original surface of the substrate being deposited upon.

3. The process of claim 1, wherein the substrates to be coated are maintained at temperatures below which a chemical reaction will occur in the adsorbed multilayer.

4. The process of claim 1, wherein the gaseous third reactant of radicals are generated in a glow discharge.

5. The process of claim 4, wherein the gaseous third reactant of radicals are generated remotely when an inert gas flows through a glow discharge in communication with the reaction chamber wherein the substrate being coated is located.

6. The process of claim 4, wherein the substrate being coated is positioned within the reaction chamber wherein a glow discharge in an inert gas creates the gaseous third reactant of radicals.

7. The process of claim 1, wherein the gaseous third reactant of radicals is created by exciting a noble gas in a glow discharge.

8. The process of claim 1, wherein the gaseous third reactant of radicals are created in a glow discharge in nitrogen gas.

9. The process of claim 1, wherein one of the first two gaseous reactants contains a halogen atom.

10. The process of claim 1, wherein one of the first two gaseous reactants is a metal-organic molecule.

11. A process of growing a thin film by an atomic layer deposition process comprising the steps of:
   placing a substrate in a reaction chamber; and
   carrying out a plurality of cycles, each cycle comprising:
   flowing an inert gas through the reaction chamber;

exposing the substrate to a gaseous first reactant, containing an element of the thin film to be formed, by adding the gaseous first reactant to the inert gas flow, wherein the first reactant adsorbs onto the substrate in a self-limiting process;

removing the gaseous first reactant from the reaction chamber volume by stopping its flow while continuing the flow of inert gas;

exposing the substrate coated with the first reactant to a gaseous second reactant, containing an element of the thin film to be formed, by adding the gaseous second reactant to the inert gas flow, wherein the second reactant adsorbs onto the substrate in a self-limiting process forming a multilayer of the first reactant and the second reactant, without a chemical reaction between the first reactant and the second reactant;

removing the gaseous second reactant from the reaction chamber volume by stopping its flow while continuing the flow of inert gas;

exposing the substrate, coated with a multilayer of the first and second reactants, to a gaseous third reactant of radicals created in a glow discharge in the inert gas, wherein the third reactant of radicals converts the multilayer on the substrate to one or more elements or compounds; and extinguishing the glow discharge while continuing the flow of inert gas;

wherein one of the gaseous reactants comprises trimethyl aluminum, the second gaseous reactant comprises water vapor, and the gaseous radicals are electronically excited noble gas atoms that convert the multilayer of trimethyl aluminum and water vapor to a thin film of aluminum oxide.

12. The process of claim 11 whereby the inert gas used is chosen from among the noble gases and nitrogen.

13. A process of growing a thin film on a substrate in a reaction chamber by an atomic layer deposition process comprising a plurality of cycles, each cycle including, in sequence, the steps of:

removing gases from the chamber;

exposing the substrate to a gaseous first reactant that includes an element of the thin film to be formed, wherein at least a portion of the first reactant adsorbs by a self-limiting process on the substrate;

removing the gaseous first reactant from the reaction chamber;

exposing the substrate, coated with at least a portion of the first reactant, to a gaseous second reactant, wherein at least a portion of the second reactant adsorbs by a self-limiting process on the substrate, thereby forming a multilayer of the first reactant and the second reactant without a chemical reaction between the first reactant and the second reactant, removing the gaseous second reactant from the reaction chamber;

exposing the substrate, coated with the multilayer of first and second reactants, to a gaseous third reactant of radicals, wherein the radicals cause a chemical reaction which converts the multilayer to one or more elements or compounds, wherein a thin film is formed; and removing the gaseous third reactant of radicals from the reaction chamber;

wherein one of the gaseous reactants comprises trimethyl aluminum, the second gaseous reactant comprises water vapor, and the gaseous radicals are electronically excited noble gas atoms that convert the multilayer of trimethyl aluminum and water vapor to a thin film of aluminum oxide.

* * * * *